United States Patent [19]
O'Connor

[11] Patent Number: 5,966,317
[45] Date of Patent: Oct. 12, 1999

[54] SHIELDED BITLINES FOR STATIC RAMS

[75] Inventor: Kevin John O'Connor, Lebanon, N.J.

[73] Assignee: Lucent Technologies Inc., Murray Hill, N.J.

[21] Appl. No.: 09/247,633

[22] Filed: Feb. 10, 1999

[51] Int. Cl.⁶ .............................. G11C 7/00; H01L 27/10
[52] U.S. Cl. .............................................. 365/53; 365/154
[58] Field of Search ............................. 365/53, 154, 156, 365/51

[56] References Cited

U.S. PATENT DOCUMENTS 5,523,968  6/1996  Kimura ..................................... 365/53

*Primary Examiner*—Vu A. Le

[57] ABSTRACT

With shrinking dimensions, and closely spaced runners, capacitive coupling between bitlines in dual port SRAMS becomes an important design issue. Techniques for reducing that coupling are described. A shielding runner placed between the read and write bitlines and tied to $V_{DD}$ or $V_{SS}$ substantially reduces unwanted crosstalk. Word lines can be similarly isolated.

6 Claims, 2 Drawing Sheets

SHIELDED BITLINES FOR STATIC RAMS

FIELD OF THE INVENTION

This invention relates to random access memory devices and particularly to multiple ported static RAM devices with multiple access line pairs.

BACKGROUND OF THE INVENTION

Dual ported SRAM cells are fundamentally different from conventional SRAM devices in that they contain a second set of access devices designed to allow a second read or write (or both) path into the cell. The cells are typically planar with all active devices located on the same level of the silicon substrate. This requires that at least a portion of all interconnections for each cell to occupy a common interconnection level. As device sizes shrink, the spacing between conductors is reduced to the point where crosstalk between runners becomes a significant design issue. This problem is aggravated in dual port devices which have at least one second pair of access runners within the same cell area.

In the usual dual port SRAM, the second pair access lines are bitlines. The interconnection layout for this cell is asymmetric with essentially four bitlines per cell and two read lines. To maintain minimum cell size with a given design rule, the four bitlines will generally be the most closely spaced. The wordlines are more widely spaced, usually sufficient to avoid undue capacitive interaction. However, from an electrical standpoint, this spacing is the opposite of that desired, since the wordline voltage swings are both large, while the read bitlines voltages are relatively small. Thus the lines most susceptible to unwanted capacitive coupling are read bitlines closely spaced to another line, usually a write bitline.

A means for reducing coupling between the closely packed runners in a dual port SRAM would allow greater optimization of cell dimensions and add design flexibility.

STATEMENT OF THE INVENTION

I have designed a dual port SRAM with reduced capacitive coupling between access lines. It is most advantageously implemented for bitlines. It involves shielding the bitlines with fixed voltage runners. The runners can be tied to ground or to the supply voltage through interlevel interconnection and can therefore "dead end" in the cell itself. The wordlines can be shielded in a similar manner.

DETAILED DESCRIPTION

Figure 1:
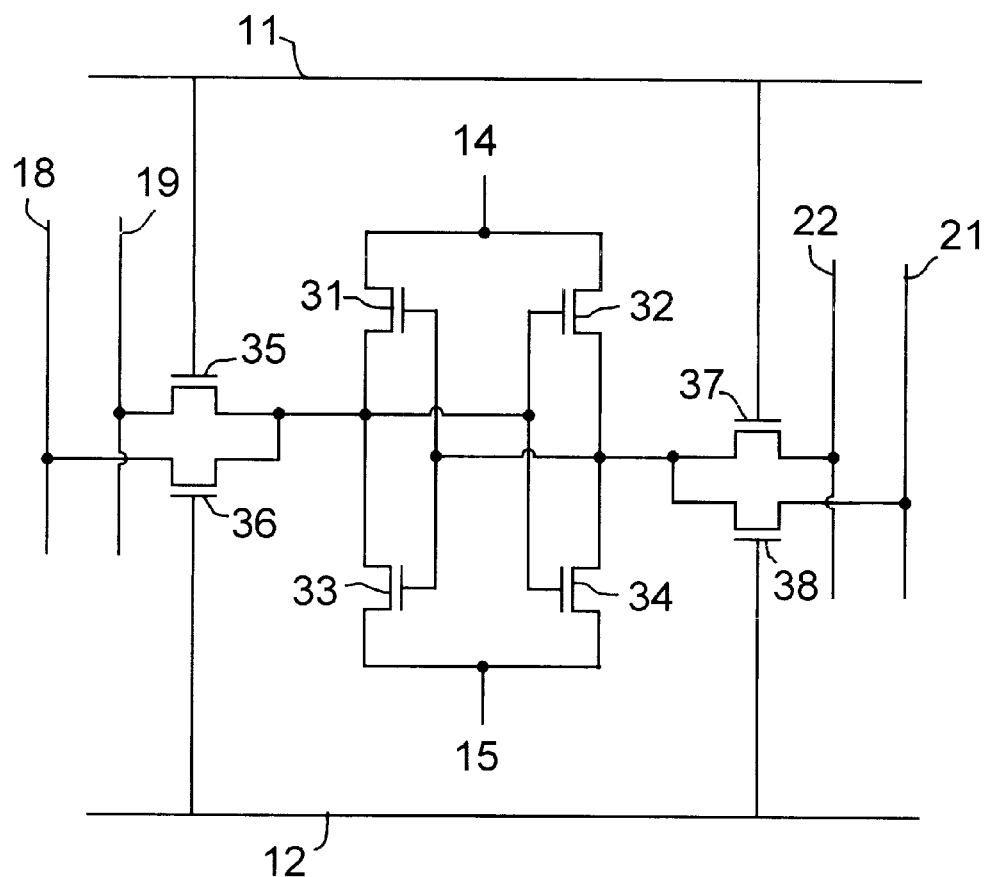
FIG. 1 is a schematic circuit diagram of a typical dual port SRAM.

Referring to FIG. 1, a schematic cell layout is shown with read wordline (RW) 11 and write wordline (WW) 12. VDD is shown at 14 and Vssat 15. The first pair of bitlines are accessed from the left of the schematic with write bit (WB) access at 18 and read bit (RB) access at 19. The second bitlines are shown to the right of the schematic with second write bit (WWB) access at 21 and second read bit (RRB) access at 22. Numbers 31–39 designate the eight transistors of the dual port SRAM cell. In this design transistors 31 and 32 are p-channel devices while the remaining transistors 33–39 are n-channel devices. The transistor structures are conventional and the cell design itself is conventional. For simplicity the design features of the cell are not shown or described in detail since the invention is associated with the cell interconnections.

Figure 2:
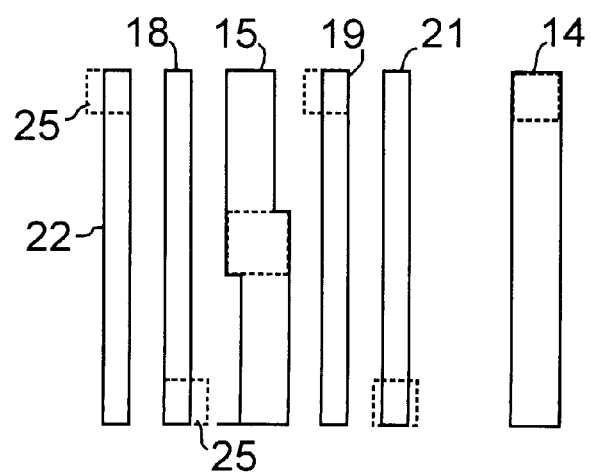
FIG. 2 is a typical topological SRAM cell layout showing a standard bitline arrangement.

A suitable cell layout for the circuit of FIG. 1 is shown in FIG. 2. For clarity, only the interconnections for the bit and wordlines and the $V_{DD}$ and $V_{SS}$ lines are shown. In this layout, these occur at metal level II and III. Metal level 0 is the gate level and metal level I is the source/drain interconnect level. The problem which is addressed by the invention appears at the level shown, metal level II. The most severe coupling problem occurs with the bitlines as can be seen from FIG. 2. The access lines have the same reference numbers as in FIG. 1. Contact pads are shown in phantom at, e.g., 25. It will be appreciated by those skilled in the art that lines 22 and 18, and lines 19 and 21 are especially susceptible to excessive capacitive coupling.

Figure 3:
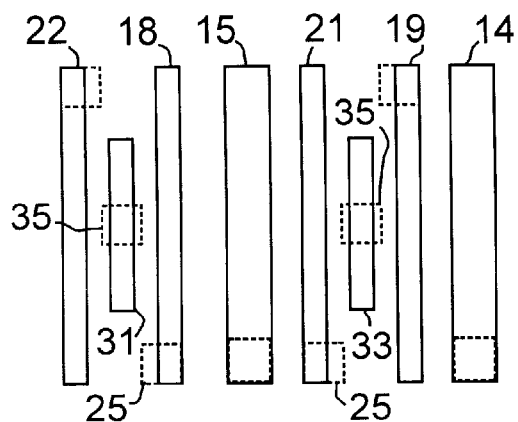
FIG. 3 is a topological SRAM cell layout showing bitline shields according to one embodiment of the invention.

This problem is addressed according to the invention by adding shielding runners between the susceptible bitlines, and tying the shielding runners to a fixed potential, e.g. $V_{DD}$ or $V_{SS}$. A suitable layout for doing this is shown in FIG. 3. Here the same reference numbers are used as in FIG. 2. The added bitline shields are shown at 31, providing shielding between RBB line 22 and WB line 18, and at 33, providing shielding between RB line 19, and WBB line 21. These shielding runners may have the same structure as the bitlines themselves, and may be produced at the same metal level using the same process steps. Thus no additional processing is required to produce the shield runners. Contact pads 35 are shown which allow interlevel interconnection of the shielding runners to $V_{DD}$ or $V_{SS}$. $V_{DD}$ or $V_{SS}$ are convenient fixed potentials in the cell structure shown to which to tie the shielding runners. However, other nodes with relatively fixed potential can also be used.

From a comparison of FIGS. 2 and 3 it will be appreciated that the cell dimensions and the overall cell design are relatively unchanged. In many cell designs the space for the shielding runners may be built into the cell design, i.e. the bitlines may be spaced wider than design rules allow, in order to avoid excessive capacitive coupling between lines. In such cases the bitline spacing may actually be shrunk with the aid of the shielding lines of the invention.

It is also evident from the figures that contact pads have been repositioned to take advantage of the "dead end" shielding runners. In the arrangement shown, which is not necessarily to scale, more than 50% of the adjacent bitlines are shielded. Alternatively, the runners can extend the full length of the bitlines and shield essentially the entire bitline.

Figure 4:
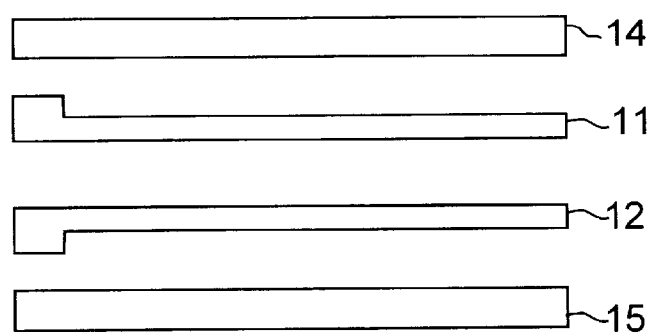
FIG. 4 is a topological SRAM cell layout showing a standard wordline arrangement.
Figure 5:
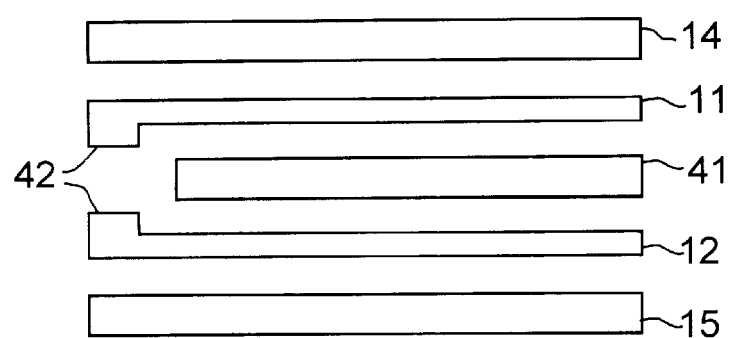
FIG. 5 is a topological SRAM cell layout showing wordline shields according to the invention.

A similar approach may be used to electrically shield the wordlines. While the coupling problem may be less severe with wordline crosstalk, advantages in some circuit designs may accrue from implementing the invention with the wordlines. For comparison, a standard wordline layout is shown in FIG. 4. This layout is for metal III in the preferred device configuration. However, if desired, the access line structure can be inverted and wordlines patterned in metal II and bitlines in metal III. Again, common reference numbers are used in FIG. 4 that correspond to similar elements in FIGS. 1–3. The read wordline 11 is shown adjacent the write wordline 12, with $V_{DD}$ bus at 14 and $V_{SS}$ bus at 15. Implementation of wordline shielding according to the invention is shown in FIG. 5, where the wordlines are now shielded by shielding runner 41, tied to $V_{DD}$. The wordline contact pads 42 have been modified to provide an efficient layout and accommodate the shielding runner. The overall size of the cell of FIG. 5 is identical to that shown in FIG. 4.

By measuring the mutual capacitance between the bitline electrodes and the total capacitance of the bitline to ground structures it is possible to compare both the coupling and loading capacitance of the unshielded and shielded cell structures.

Measurements were made on a model device of the invention with a size approximately 13 mm×14 mm (scaled approximately 2200×) using a high K fluid as the dielectric medium. This method provides capacitance scaling more than sufficient for accurate comparative measurements using a bridge device. Reference measurements were made with both ethylene glycol and glycerol. These produced relative dielectric constants of about 44 (near textbook values).

Two conditions were characterized in an effort to account for the effect of all the layers and the structure below metal I and II layers but above the ground substrate. This was done by inserting a plate that effectively raised the ground plane. The actual ground plane should lie somewhere in between. These two conditions are referred to as near and far conditions.

The following Tables show the absolute measurements and relative effects.

TABLE I

| Cap | Old Cell (pf) | | New Cell (pf) | |
| --- | --- | --- | --- | --- |
| | far | near | far | near |
| Total | 26.0 | 28.0 | 28.0 | 29.5 |
| Mutual | 0.65 | 0.42 | 0.34 | 0.28 |

TABLE II

| Cap | Absolute Differences (pf) | |
| --- | --- | --- |
| Total | 2.0 | 1.5 |
| Mutual | −0.32 | −0.14 |

TABLE III

| Cap | Relative Differences (pf) | |
| --- | --- | --- |
| Total | 7.7% | 5.4% |
| Mutual | −48.5% | −33.3% |

It should be clear from Table III that there is a much greater reduction in the mutual capacitance by adding the shielding runners than there is an increase in total capacitance to ground. The improvement in isolation is on the order of 30–50%. The impact of total capacitance is quite easily accounted for by increased driver strength in the write bitline drivers. The 5–8% increase in the read bitline loading can be accounted for with slightly increased delay in the readout path, or by increasing the sense amplifier gain.

The invention has been described in detail as applying to a dual port memory device but is equally applicable to multiport devices, i.e. where there are at least two ports, or at least two pairs of access lines serving each cell.

The invention is most advantageously applied to pairs of adjacent conductors with one of the conductors carrying a cell drive signal, typically with data to be written into the cell, and the other conductor carrying signals from the cell which reflect a given condition in the cell. These signals typically have significantly different signal strengths, and are most apt to be susceptible to harmful crosstalk.

Various additional modifications of this invention will occur to those skilled in the art. All deviations from the specific teachings of this specification that basically rely on the principles and their equivalents through which the art has been advanced are properly considered within the scope of the invention as described and claimed.

We claim:

1. A memory cell with cell access lines in an x-y plane comprising:

(a) a read wordline and a write wordline extending in an x-direction, (b) a pair of write bitlines and a pair of read bitlines extending in the y-direction, wherein at least one write bitline is adjacent a read bitline, (c) a shielding runner extending between said write bitline and said read bitline, and (d) means for connecting said shielding runner to a fixed potential.

2. The memory cell of claim 1 wherein said fixed potential is $V_{DD}$.

3. The memory cell of claim 1 wherein said fixed potential is $V_{SS}$.

4. The memory cell of claim 1 wherein said shielding runner extends along at least 50% of the length of said read bitline.

5. The memory cell of claim 1 additionally including:

(e) a wordline shielding runner extending between said read wordline and said write wordline, and (f) means for connecting said wordline shielding runner to a fixed potential.

6. A memory cell with cell access lines in an x-y plane comprising:

(a) at least one pair of bitlines extending in an x-direction, (b) a read word line and a write wordline extending in the y-direction, (c) a shielding runner extending between said read wordline and said write wordline, and (d) means for connecting said shielding runner to a fixed potential.

* * * * *